(12) United States Patent  
Matsui

(10) Patent No.: US 7,762,415 B2  
(45) Date of Patent: Jul. 27, 2010

(54) WATERPROOF BOX FOR A WIRING HARNESS CONNECTOR

(75) Inventor: Yoshio Matsui, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 560 days.

(21) Appl. No.: 11/713,721

(22) Filed: Mar. 5, 2007

(65) Prior Publication Data

US 2007/0215614 A1  Sep. 20, 2007

(30) Foreign Application Priority Data

Mar. 6, 2006 (JP) .............................. 2006-059816
Aug. 10, 2006 (JP) .............................. 2006-217693

(51) Int. Cl.
| | |
|---|---|
| *H02G 3/14* | (2006.01) |
| *H02G 3/16* | (2006.01) |
| *H02G 3/08* | (2006.01) |
| *H02G 3/18* | (2006.01) |
| *B65D 6/28* | (2006.01) |

(52) U.S. Cl. .................. 220/4.02; 220/3.2; 220/3.8; 174/58; 174/60

(58) Field of Classification Search .............. 220/3.2, 220/3.8, 4.33, 661, 676, 4.02; 174/58, 60
See application file for complete search history.

(56) References Cited

U.S. PATENT DOCUMENTS

| | | | | |
|---|---|---|---|---|
| 3,392,228 | A | * | 7/1968 | Zerwes ........................ 174/542 |
| 3,910,448 | A | * | 10/1975 | Evans et al. .................. 220/3.8 |
| 4,223,796 | A | * | 9/1980 | Silver .......................... 220/3.8 |
| 4,323,723 | A | * | 4/1982 | Fork et al. ................... 174/484 |
| 4,620,061 | A | * | 10/1986 | Appleton ...................... 174/51 |
| 4,959,018 | A | * | 9/1990 | Yamamoto et al. .......... 439/76.1 |
| 5,285,900 | A | * | 2/1994 | Swingler ..................... 206/508 |
| 5,306,870 | A | * | 4/1994 | Abat .......................... 174/659 |
| 5,399,103 | A | * | 3/1995 | Kuboshima et al. .......... 439/509 |
| 5,532,431 | A | * | 7/1996 | Saka et al. ................... 174/521 |
| 5,574,254 | A | * | 11/1996 | Mori et al. ................... 174/561 |
| 5,650,591 | A | * | 7/1997 | Matsushita et al. ....... 174/17 VA |
| 5,703,325 | A | * | 12/1997 | Yamaguchi et al. ........... 174/50 |
| 5,722,863 | A | * | 3/1998 | Yanase ....................... 439/718 |

(Continued)

FOREIGN PATENT DOCUMENTS

JP          2000115955  A  *  4/2000

(Continued)

*Primary Examiner*—Anthony Stashick
*Assistant Examiner*—Ned A Walker
(74) *Attorney, Agent, or Firm*—Kratz, Quintos & Hanson, LLP

(57) ABSTRACT

For providing a waterproof box, which can prevent penetration of liquid like water through a gap between a box main body and a cover member mounted on the box main body, the waterproof box includes the box main body having an opening formed by surrounding with a plurality of side-walls, a lid mounted on the box main body for covering the opening, a grommet, and a seal member formed into a ring shape to be mounted on the lid for waterproofing between the box main body and the lid. A cutout side-wall has a cutout. The grommet to be mounted on the box main body fills the cutout. The seal member has a contact portion to abut on an edge of the cutout side-wall. A thickness of the contact portion is formed thicker than that of the other portion of the seal member.

4 Claims, 6 Drawing Sheets

U.S. PATENT DOCUMENTS

| | | | | |
|---|---|---|---|---|
| 5,845,803 A * | 12/1998 | Saito et al. | | 220/378 |
| 5,912,433 A * | 6/1999 | Pulido et al. | | 174/77 R |
| 6,069,317 A * | 5/2000 | Wagganer | | 174/650 |
| 6,098,825 A * | 8/2000 | Kohnen | | 220/3.2 |
| 6,170,689 B1 * | 1/2001 | Flesher et al. | | 220/7 |
| 6,401,957 B1 * | 6/2002 | Przytulla | | 220/319 |
| 6,492,590 B1 * | 12/2002 | Cheng | | 174/50 |
| 6,545,217 B2 * | 4/2003 | Sato | | 174/50 |
| 6,629,619 B2 * | 10/2003 | Sato et al. | | 220/4.02 |
| 6,743,981 B2 * | 6/2004 | Miyakoshi | | 174/668 |
| 6,768,054 B2 * | 7/2004 | Sato et al. | | 174/50 |
| 6,919,509 B2 * | 7/2005 | Oda | | 174/59 |
| 6,969,800 B1 * | 11/2005 | Liao | | 174/50 |
| 7,077,281 B2 * | 7/2006 | Sato et al. | | 220/3.8 |
| 7,265,292 B2 * | 9/2007 | Greenfield | | 174/67 |
| 7,270,245 B2 * | 9/2007 | Cheng et al. | | 220/62.1 |
| 7,428,976 B2 * | 9/2008 | Cheng et al. | | 220/642 |
| 7,459,630 B2 * | 12/2008 | Pedret et al. | | 174/50 |
| 2002/0084271 A1 * | 7/2002 | Sato et al. | | 220/3.8 |
| 2003/0000720 A1 * | 1/2003 | Sato | | 174/50 |
| 2003/0000726 A1 * | 1/2003 | Miyakoshi | | 174/65 R |
| 2003/0102143 A1 * | 6/2003 | Sato et al. | | 174/65 G |
| 2003/0106894 A1 * | 6/2003 | Budowski et al. | | 220/4.28 |
| 2003/0136780 A1 * | 7/2003 | Sato et al. | | 220/3.8 |
| 2003/0168461 A1 * | 9/2003 | Richardson | | 220/661 |
| 2006/0089020 A1 * | 4/2006 | Kanamaru | | 439/76.2 |
| 2006/0089021 A1 * | 4/2006 | Kanamaru | | 439/76.2 |

FOREIGN PATENT DOCUMENTS

| | | | |
|---|---|---|---|
| JP | 2002152947 A * | 5/2002 | |
| JP | 2002152948 A * | 5/2002 | |
| JP | 2004-72876 | 3/2004 | |
| JP | 2006136129 A * | 5/2006 | |

* cited by examiner 006-217693 upon which this patent application is based is hereby incorporated by reference.

WATERPROOF BOX FOR A WIRING HARNESS CONNECTOR

The priority application Number Japan Patent Application 2006-217693 upon which this patent application is based is hereby incorporated by reference.

BACKGROUND OF THE INVENTION

1. Field of the Invention

This invention relates to a waterproof box to be mounted on an automobile as a vehicle.

2. Description of the Related Art

In an automobile as a vehicle, various electronic apparatuses, such as a lamp like a headlamp or a tail lamp and a motor like a starter motor and a motor for air-conditioner, are installed.

For supplying electric power to the various apparatuses, a wiring harness is wired in the automobile. The wiring harness includes a plurality of electric wires and a connector joined with ends of electric wires. The electric wire is covered wire having a conductive core and a cover covering the core. The connector has a terminal formed with a conductive sheet metal to be connected with the core and a connector housing receiving the terminal. The wiring harness is wired in the automobile so as to connect the connector to a power supply and various electronic apparatuses.

The connector of the wiring harness requires to be waterproofed. Therefore, the connector is received in a waterproof box for preventing that liquid like water penetrates into the connector. The waterproof box includes a box main body having an opening, a lid capable to be detached freely from the box main body and covering the opening when the lid is attached on the box main body, and a seal member formed into a shape substantially same as an outer edge of the opening and attached on one of the box main body and the lid for waterproofing between the box main body and the lid.

The box main body includes a plurality of side-walls structuring the opening by surrounding the opening. The side-wall is provided with a cutout formed by cutting the side-wall to be apart from an edge of the side-wall close to the opening. A grommet as a cover member for passing the electric wires of the wiring harness therethrough is mounted on the box main body. The grommet mounted on the box main body covers the cutout for waterproofing between the box main body and the wiring harness. The seal member made of an elastic material like rubber abuts on the edges of the side-walls and grommet so as to be deformed elastically for waterproofing between the box main body and the lid.

According to the waterproof box, the connector of the wiring harness, the electric wires of which are passed through the grommet, is received in the box main body and the grommet is mounted on the box main body. Thereafter, the lid, on which the seal member is fixed, is attached on the box main body. Thereby, the connector is received in the waterproof box. Thus, the waterproof box prevents the connector from penetration of liquid like water.

SUMMARY OF THE INVENTION

Objects to be Solved

According to the above waterproof box, the cutout is provided and the grommet for covering the cutout is mounted on the box main body. Thereby, a gap exists between the side-wall and the grommet. Although the seal member waterproofs between the lid and the side-walls and between the lid and the grommet, water penetrates into the waterproof box through the gap between the side-wall and the grommet, especially the gap generated near the opening.

According to the above problem, an object of the present invention is to provide a waterproof box, which can prevent penetration of liquid like water through a gap between a box main body and a covering member mounted on the box main body. How to attain the object of the present invention In order to overcome the above problems and attain the object of the present invention, a waterproof box according to the present invention is characterised in that the waterproof box includes a box main body having an opening formed by a plurality of side-walls surrounding the opening; a lid mounted on the box main body so as to cover the opening by being mounted on the box main body; a seal member formed into a ring shape, and attached on one of the box main body and the lid for waterproofing between the box main body and the lid by abutting on edges of side-walls; and at least one cutout side-wall from among the plurality of side-walls is provided with a cutout formed by cutting the at least one cutout side-wall to be apart from an edge thereof close to the opening, and the waterproof box further includes a cover member mounted on the box main body so as to cover the cutout by being mounted on the box main body, and a thickness of a contact portion of the seal member, which abuts on the edge of the cutout side-wall provided with the cutout, is thicker than that of the other portion of the seal member other than the contact portion.

The waterproof box mentioned above is characterised in that the contact portion of the seal member has a main body having a thickness same as that of the other portion, and a projecting body piled on the main body and projecting more than the other portion toward the cutout side-wall; and the projecting body is formed with a material softer than the other material forming the main body.

A waterproof box is characterised in that the waterproof box includes a box main body having an opening formed by a plurality of side-walls surrounding the opening; a lid mounted on the box main body so as to cover the opening by being mounted on the box main body; a seal member formed into a ring shape, and attached on one of the box main body and the lid for waterproofing between the box main body and the lid by abutting on edges of side-walls; and at least one cutout side-wall from among the plurality of side-walls is provided with a cutout formed by cutting the at least one cutout side-walls to be apart from an edge thereof close to the opening, and the waterproof box further includes a cover member mounted on the box main body so as to cover the cutout by being mounted on the box main body, and a width of a contact portion of the seal member, which abuts on the edge of the cutout side-wall provided with the cutout, is wider than that of the other portion of the seal member other than the contact portion.

The waterproof box mentioned above is characterised in that the contact portion of the seal member comprises a contact surface, which is slant both in a piling direction of piling the box main body and the lid to each other and in a perpendicular direction perpendicular to the piling direction so as to abut both on the edge of the cutout side-wall and the cover member, formed in a full length of the contact portion.

The waterproof box mentioned above is characterised in that the contact surface is slant along the perpendicular direction to become closer to the edge of the cutout side-wall in accordance with position approaching an outside of one of the box main body and the lid.

The waterproof box mentioned above is characterised in that the contact portion of the seal member includes a main body having a thickness and a width same as those of the other portion; a first projecting body projecting from the main body toward the cutout side-wall; and a second projecting body projecting along the perpendicular direction from the first projecting body toward an outside of one of the box main body and the lid.

According to the waterproof box of the present invention, the thickness of the contact portion of the seal member is formed thicker than that of the other portion of the seal member other than the contact portion, so that volume of elastic deformation of the contact portion is larger than that of the other portion when the box main body and the lid are attached to each other.

According to the waterproof box of the present invention, the projecting body of the contact portion is formed with the material softer than the other material forming the main body, so that the projecting body is elastically deformed larger than the main body when the contact portion is elastically deformed between the box main body and the lid.

According to the waterproof box of the present invention, the width of the contact portion of the seal member is formed wider than that of other portion of the seal member other than the contact portion, so that volume of elastic deformation of the contact portion is larger than that of the other portion when the box main body and the lid are attached to each other.

According to the waterproof box of the present invention, the contact surface formed in the full length of the contact portion of the seal member is slant both in the piling direction of piling the box main body and the lid to each other and in a perpendicular direction perpendicular to the piling direction, so that a contact area between the contact portion, and the edge of the cutout side-wall and the cover member becomes larger than that between the other portion and the edges of the side-walls.

According to the waterproof box of the present invention, the contact surface formed in the full length of the contact portion of the seal member is slant to become closer to the edge of the cutout side-wall in accordance with position approaching the outside, so that a contact point of the contact portion and the edge of the cutout side-wall is positioned gradually upward in accordance with the contact point approaching an inside of the box main body.

According to the waterproof box of the present invention, the contact portion includes the first projecting body projecting from the main body toward the cutout side-wall, and the second projecting body from the first projecting body toward the outside, so that the second projecting body is arranged mostly at an outside of the box main body from the cutout side-wall.

EFFECTS OF THE INVENTION

According to the waterproof box of the present invention, the volume of elastic deformation of the contact portion is larger than that of the other portion when the box main body and the lid are attached to each other, so that a part of the contact portion penetrates into a gap between the box main body and the cover member. Thereby, the seal member fills the gap between the box main body and the cover member near the opening so as to prevent penetration of liquid like water through the gap.

According to the waterproof box of the present invention, the projecting body is elastically deformed larger than the main body when the contact portion is elastically deformed between the box main body and the lid, so that the projecting body between the box main body and the cover member near the gap is elastically more deformed, thereby the projecting body can seal the gap securely. Therefore, penetration of liquid like water through the gap between the box main body and the cover member can be prevented.

According to the waterproof box of the present invention, the volume of elastic deformation of the contact portion is larger than that of the other portion of the seal member, so that a part of the contact portion penetrates into the gap between the box main body and the cover member. Thereby, the seal member seals the gap between the box main body and the cover member near the opening, and penetration of liquid like water through the gap can be prevented.

According to the waterproof box of the present invention, the contact area between the contact portion, and the edge of the cutout side-wall and the cover member becomes larger than that between the other portion and the edges of the side-walls, so that the seal member seals the gap between the box main body and the cover member near the opening, thereby penetration of liquid like water through the gap can be prevented.

According to the waterproof box of the present invention, the contact point of the contact portion and the edge of the cutout side-wall is positioned gradually upward in accordance with the contact point approaching the inside of the box main body, so that it is difficult that liquid like water penetrates into the box main body through the gap between the seal member and the edges of the cutout side-wall.

According to the waterproof box of the present invention, the second projecting body is arranged mostly at an outside of the box main body from the cutout side-wall, so that it is difficult that liquid like water penetrates into the box main body through the gap between the seal member and the edge of the cutout side-wall.

The above and other objects and features of this invention will become more apparent from the following description taken in conjunction with the accompanying drawings.

DESCRIPTION OF THE PREFERRED EMBODIMENT

A first embodiment of a waterproof box according to the present invention will be described as followings with reference to FIGS. 1-5.

Figure 1:
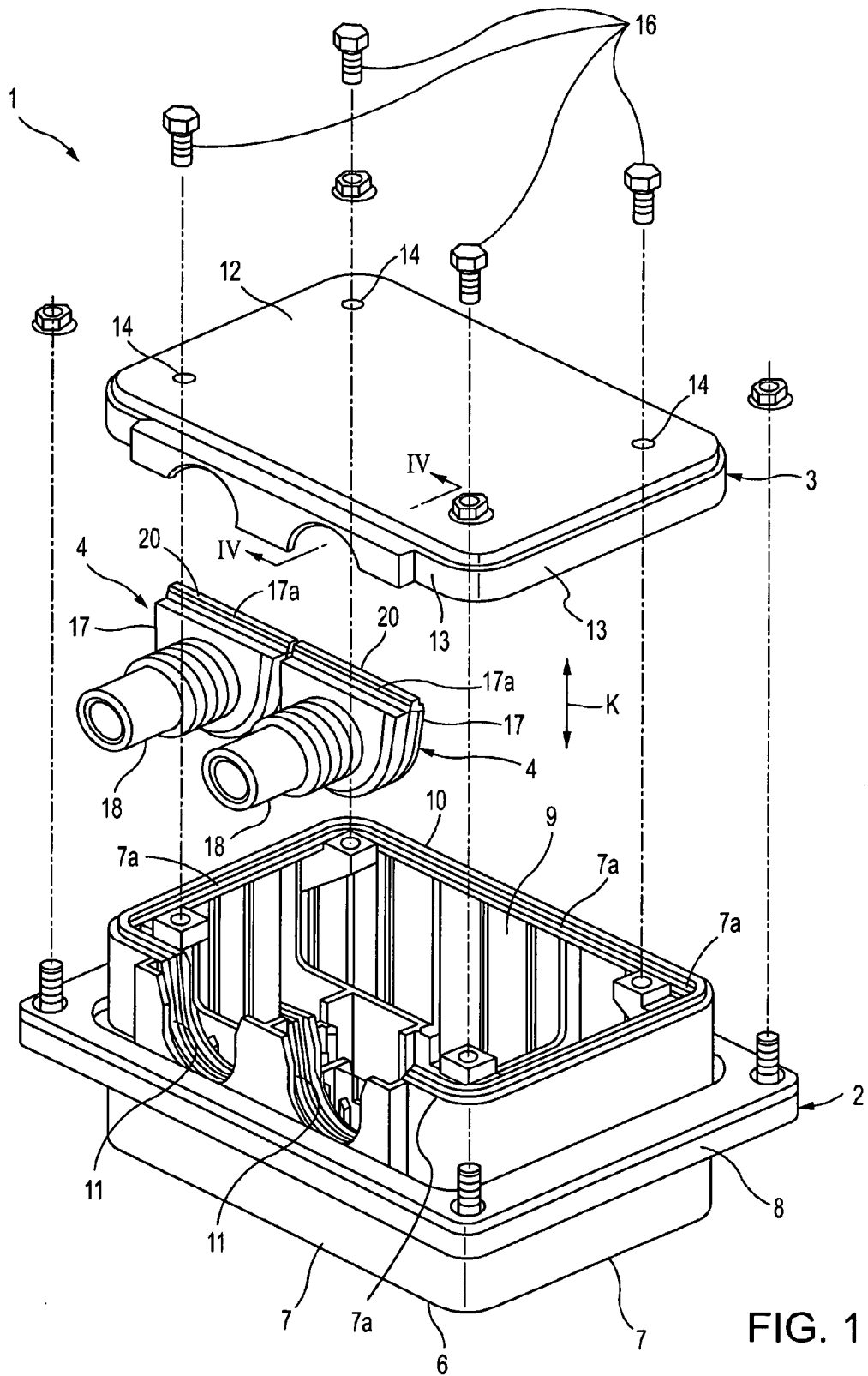
FIG. 1 is an exploded perspective view of a waterproof box of a first embodiment according to the present invention.

The waterproof box according to the embodiment shown in FIG. 1 is mounted on a automobile as a vehicle for receiving a connector of a wiring harness wired in the automobile. The wiring harness has a plurality of electric wires and a connector joined to ends of the electric wires. The wire includes a conductive core and an insulation cover for covering the core. The connector has a terminal made of conductive sheet metal to be connected with the core of the electric wire and an insulation connector housing for receiving the terminal. The wiring harness supplies required electric power and signals to various electronic apparatuses installed in the automobile by connecting the connector to the electronic apparatuses.

Figure 2:
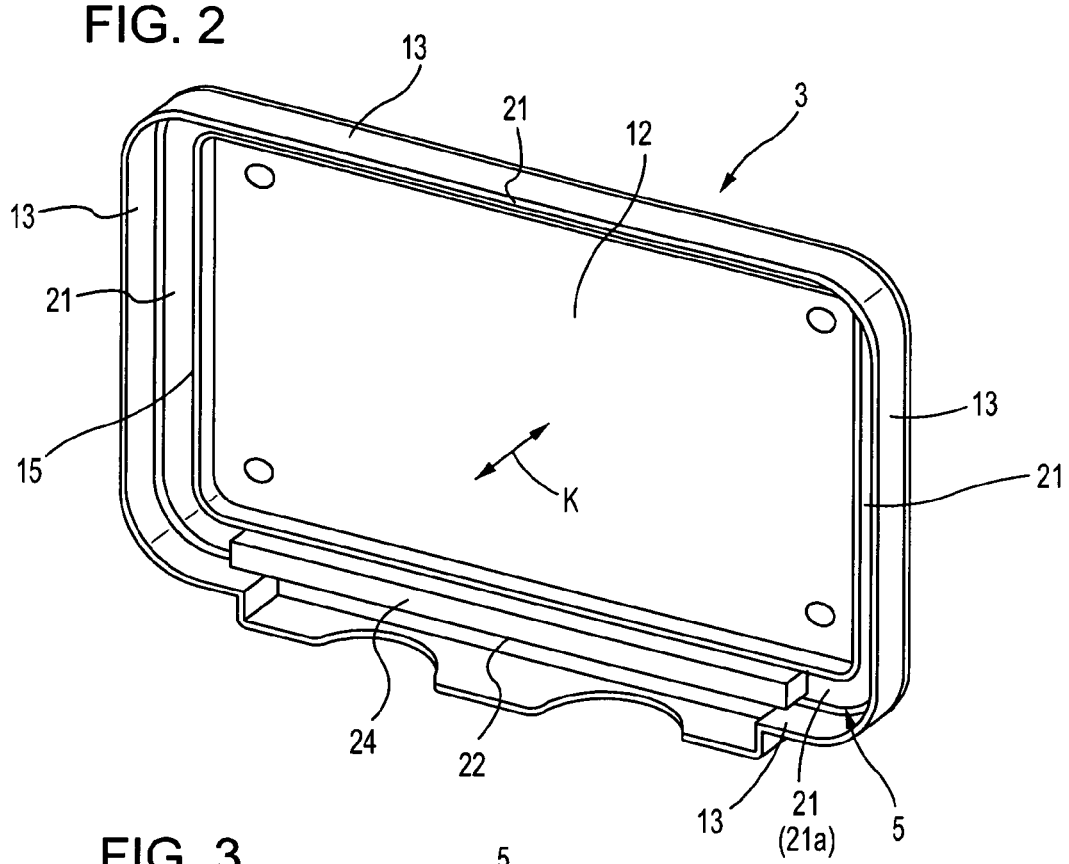
FIG. 2 is a perspective view of a lid and a seal member of the waterproof box shown in FIG. 1.

As shown in FIG. 1, the waterproof box 1 includes a box main body 2, a lid 3, a grommet 4 as a cover member, and a seal member 5 (shown in FIG. 2).

The box main body is made of insulation synthetic resin, and includes a bottom wall 6, a plurality of side-walls 7 extending vertically from an outer edge of the bottom wall 6, and a flange so as to be formed into a bottomed tube shape. The flange 8 projects from outer surfaces of the side-walls 7 to surround the box main body 2. The box main body 2 has an opening 9 formed to be surrounded by the plurality of side-walls 7. The opening 9 communicates an outside and an inside of the box main body 2.

A lip 10 projects from an edge 7a at a far side of the side-wall 7 from the bottom wall 6. One cutout side-wall 7 of the box main body 2 is provided with a cutout 11. In the embodiment, two cutouts are provided. The cutouts 11 cut out the cutout side-wall 7 so as to extend from the edge 7a of the cutout side-wall 7 at the far side from the bottom wall 6 in a direction to be close to the bottom wall 6, that is a direction to be apart from the opening 9.

A nut is provided on an inner surface of the side-wall 7 in the box main body 2. The nut is arranged in a corner of the box main body 2.

The lid 3 is made of insulation synthetic resin, and includes a flat top plate 12, and a plurality of side walls 13 extending vertically from an outer edge of the top plate 12. A bolt hole 14 passes through the top plate 12. When the lid 13 is positioned at a position to cover the opening 9 of the box main body 2, the bolt hole 14 corresponds to the nut provided on the inner surface of the side wall 13.

A seal member receiving groove 15 is provided around the lid 3 at in side of the side walls 13 as shown in FIG. 2. When the lid 3 is positioned at the position to cover the opening 9 of the box main body 2, the seal member receiving groove 15 corresponds to the lips 10 of the side-walls 7 and the lip 20 provided at a later-described plate portion 17 of the grommet 4. By screwing a bolt 16 passed through the bolt hole 14 into the nut, the lid 3 is mounted on the box main body 2 to cover the opening 9. When the box main body 2 and the lid 3 are combined to each other, a direction in which the bottom wall 6 and the top plate 12 face to each other is equal to a direction K in which the box main body 2 and the lid 3 pile on each other (shown in FIG. 1). Therefore, the direction K of piling the box main body 2 and the lid 3 intersect perpendicularly both the bottom wall 6 and the top plate 12.

The grommet 4 has the plate portion 17, and a tube portion in one body. The plate portion 17 is formed into a flat plate shape to be similar as a shape in a flat plan of the cutout 11. The plate portion 17 is provided with a through hole 19 (shown in FIG. 5). The tube portion 18 is formed into a tube shape continued to an end portion of the through hole 19 at an outside of the waterproof box 1.

The grommet 4 passes the electric wires of the wiring harness through the tube portion 18 and the through hole 19, and is mounted on the box main body 2 so as to fill the cutout with the plate portion 17. The grommet 4 is provided at an edge 17a of the plate portion 17, which is substantially in the same plan as the edge 7a of the side-wall 7 when the grommet 4 is mounted on the box main body 2, with the lip 20 projecting from the edge 17a.

The seal member 5 is made of foam rubber like chloroprene rubber, and EPDM (Ethylene Propylene Diene Monomer). The seal member 5 is formed into a ring shape having four pillars 21. The pillar 21 is formed into a beam shape. The pillars 21 are continued to each other at ends thereof. The seal member 5 is attached on the lid 3 so as to be received in the seal member receiving groove 15 as shown in FIGS. 2, 4.

The seal member 5 attached on the lid 3 abuts on the edges 7a of the side-walls 7 and the edge 17a of the plate portion 17 of the grommet 4 so as to be pushed and elastically deformed by the lips 10, 20 provided at the edges 7a and 17a. Thereby, the seal member 5 waterproofs between the box main body 2 and the lid 3. One pillar 21a of the seal member 5, which abuts on the edge 7a of the cutout side-wall 7 provided with the cutout 11, has a contact portion 22.

The contact portion 22 abuts on the edge 7a of the cutout side-wall 7 provided with the cutout 11 and the edge 17a of the plate portion 17 of the grommet 4. A thickness T of the contact portion 22 is formed thicker than a thickness t of the other portion of the seal member 5 other than the contact portion 22. The thickness T, t are dimensions in a direction of the lid 3 and the box main body 2 piling on each other. A width H of the contact portion 22 is formed equal to a width h of the other portion of the seal member 5. The widths H, h are dimensions in a perpendicular direction perpendicular to the direction of the lid 3 and the box main body 2 piling on each other.

Figure 3:
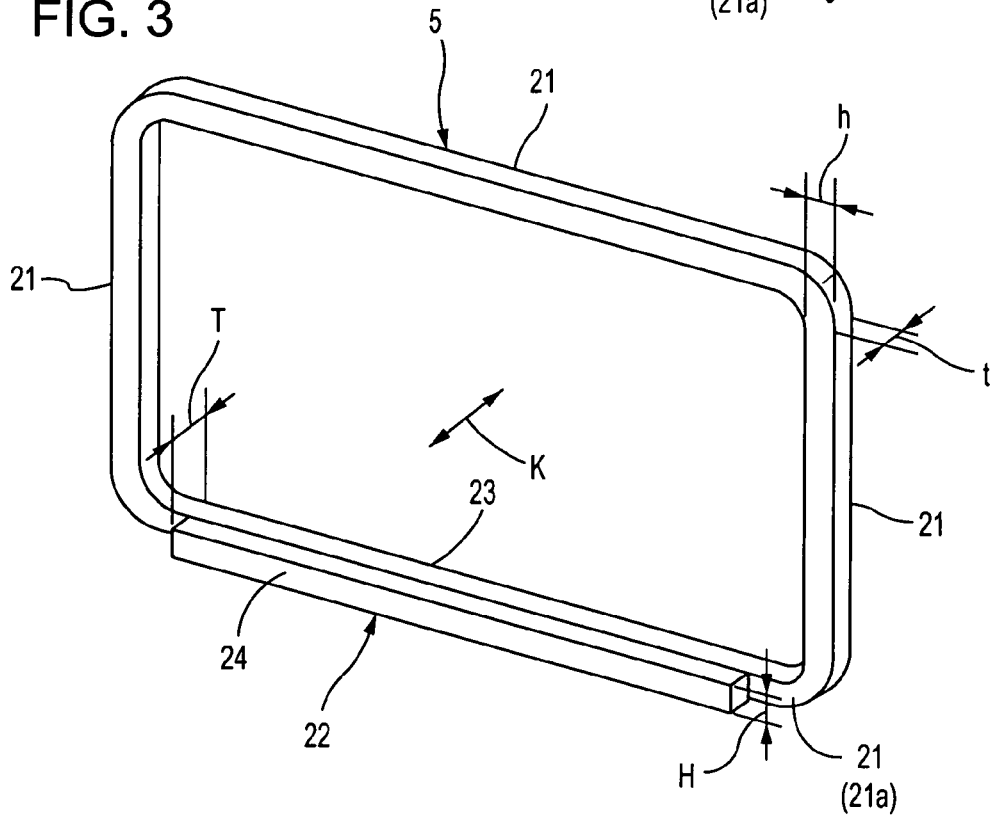
FIG. 3 is a perspective view of the seal member of the waterproof box shown in FIG. 1.
Figure 4:
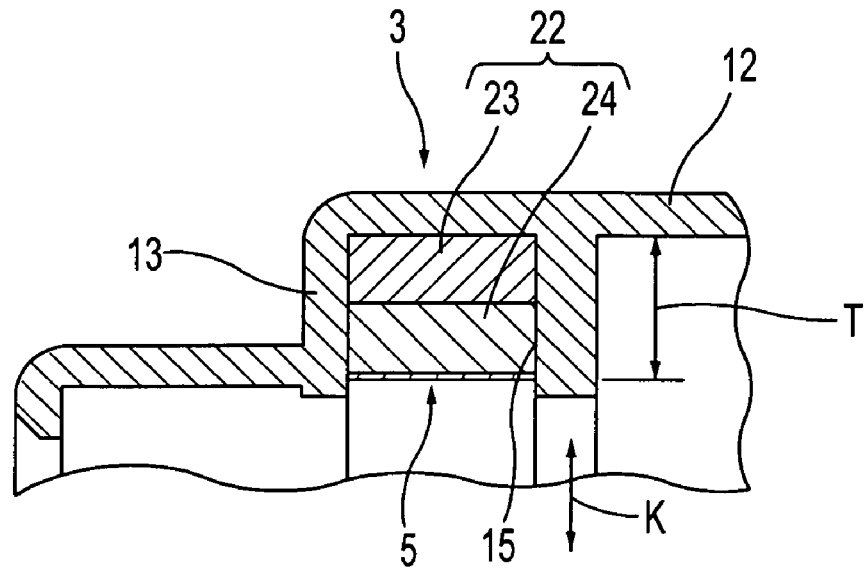
FIG. 4 is a cross-sectional view taken along the line IV-IV shown in FIG. 1.
Figure 5:
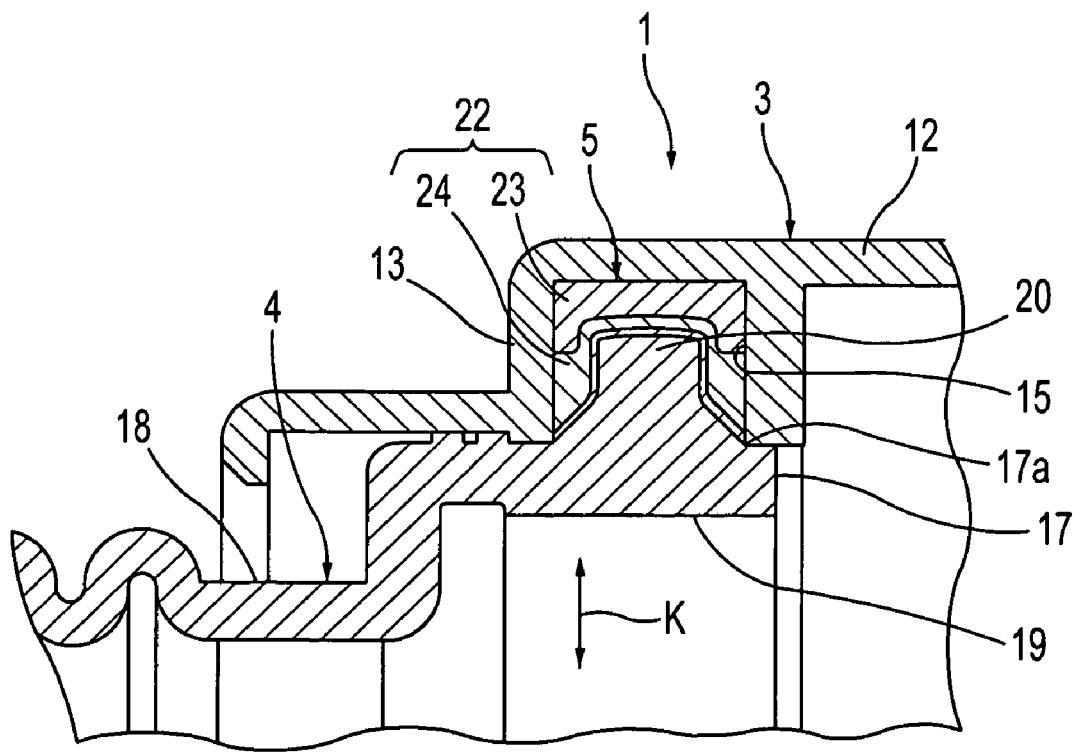
FIG. 5 is a cross-sectional view of a particular area of the waterproof box shown in FIG. 1.

The contact portion 22 includes a main body 23 and a projecting body 24 as shown in FIGS. 3, 4. The main body 23 is formed in thickness and width equal to the other portion of the seal member 5 other than the contact portion 22 so as to be integrated with the other portion. The projecting body 24 is piled on a surface of the main body 23 close to the box main body 2. Thereby, the projecting body 24 projects more than the main body 23 toward the box main body 2. The projecting body 24 is formed in width equal to the other portion of the seal member 5 other than the contact portion 22. The projecting body 24 of the contact portion 22 is formed with a softer material than the main body 23. The seal member 5 is assembled by attaching the projecting body 24 on the main body 23 after forming the main body 23 and the other portion integrally.

According to the waterproof box 1 mentioned above, by mounting the grommet 4 on the box main body 2 after passing the electric wires of the wiring harness through the grommet 4, the connector of the wiring harness is received in the box main body 2. Attaching the lid 3 on the box main body 2, the waterproof box 1 as structured above is assembled. Thereby, the seal member 5 pushed by the lips 10, 20 is elastically deformed to waterproof between the lid 3 and the box main body 2, so that it is prevented that liquid like water penetrates into the box main body 2.

According to this embodiment, since the thickness T of the contact portion 22 of the seal member 5 is formed thicker than that of the other portion, the contact portion 22 is elastically deformed larger than the other portion when the box main body 2 and the lid 3 are attached to each other. Thereby, the contact portion 22 penetrates partially into a gap between the box main body 2 and the plate portion 17 of the grommet 4, and covers the lip 20 of the grommet 4. Thus, the seal member 5 fills the gap between the box main body 2 and the plate portion 17 of the grommet 4 near the opening 9, so that it can be prevented that liquid like water penetrates through the gap into the box main body 2.

Since the projecting body 24 is formed with the softer material than the main body 23, the projecting body 24 is elastically deformed larger than the main body 23 when the contact portion 22 is elastically deformed between the box main body 2 and the lid 3. Thereby, the projecting body 24 near the gap between the box main body 2 and the plate portion 17 of the grommet 4 is elastically deformed more, so that the projecting body 24 can fill the gap securely. Therefore, it can be prevented that liquid like water penetrates through the gap between the box main body 2 and the plate portion 17 of the grommet 4.

Figure 6:
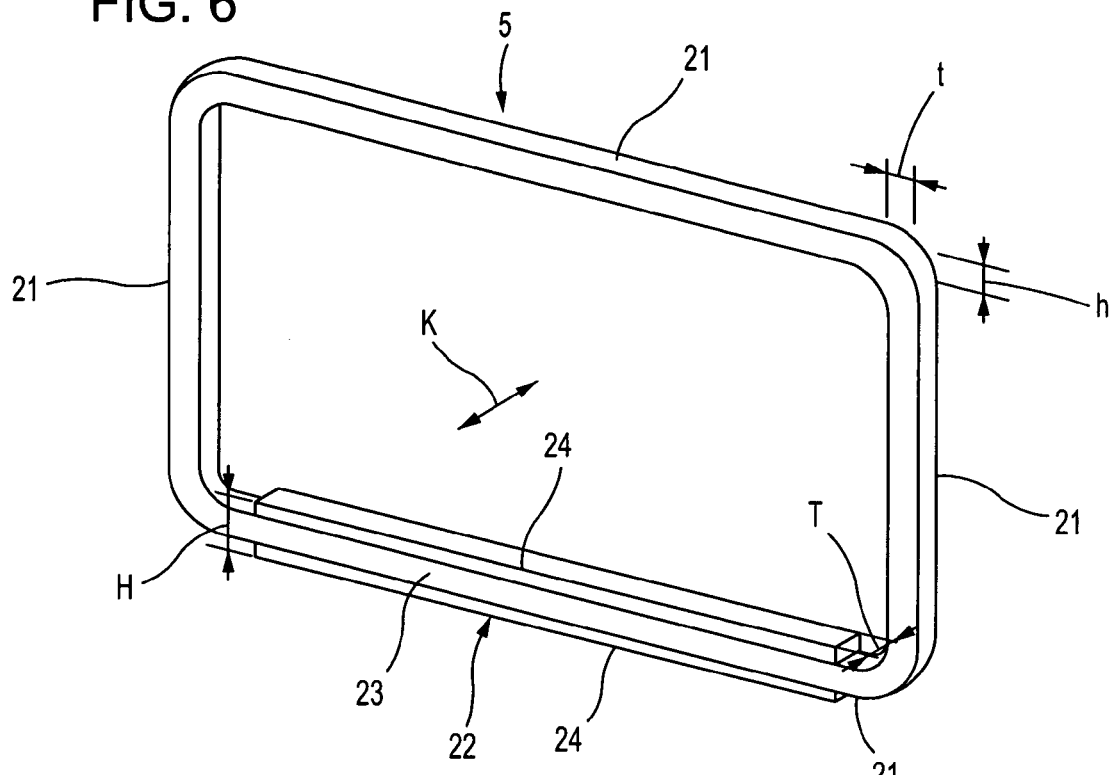
FIG. 6 is a perspective view of a modification of the seal member shown in FIG. 3.

According to the first embodiment, the thickness T of the contact portion 22 is formed thicker than that of the other portion. According to the present invention, it can be effected that the width H of the contact portion 22 of the seal member 5 is formed wider than that of the other portion as shown in FIG. 6. With respect to FIG. 6, components same as the above embodiment are put with the same remarks and the description is omitted. Since the width H of the contact portion 22 of the seal member 5 is formed wider than that of the other portion, the contact portion 22 is elastically deformed larger than the other portion when the box main body 2 and the lid 3 are attached to each other. Thereby, the contact portion 22 penetrates partially into a gap between the box main body 2 and the plate portion 17 of the grommet 4, and covers the lip 20 of the grommet 4. Thus, the seal member 5 fills the gap between the box main body 2 and the plate portion 17 of the grommet 4 near the opening 9, so that it can be prevented that liquid like water penetrates through the gap into the box main body 2.

According to the present invention, both of the width H and the thickness T of the contact portion 22 can be larger than the width h and the thickness t of the other portion in the waterproof box 1 of a second embodiment shown in FIGS. 7-10. In the embodiment, components same as the above embodiment are put with the same remarks and the description is omitted.

Figure 7:
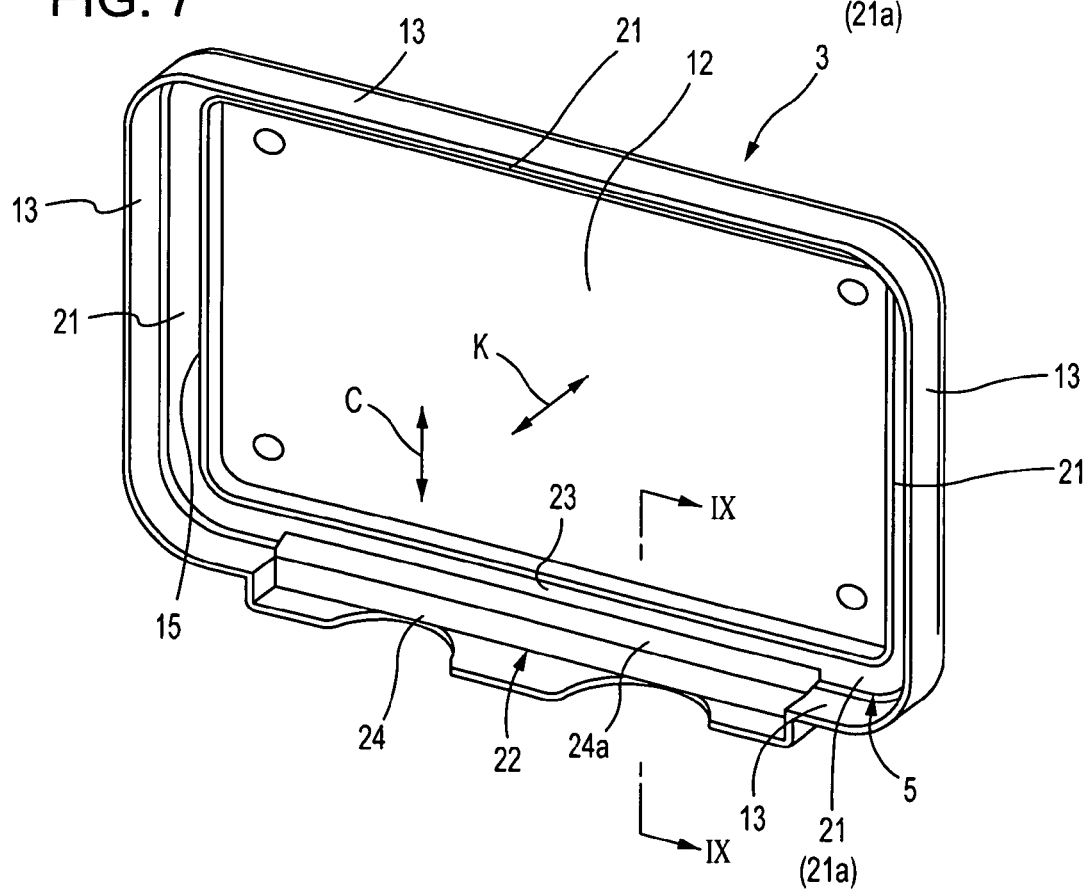
FIG. 7 is a perspective view of a lid and a seal member of a waterproof box of a second embodiment according to the present invention.
Figure 8:
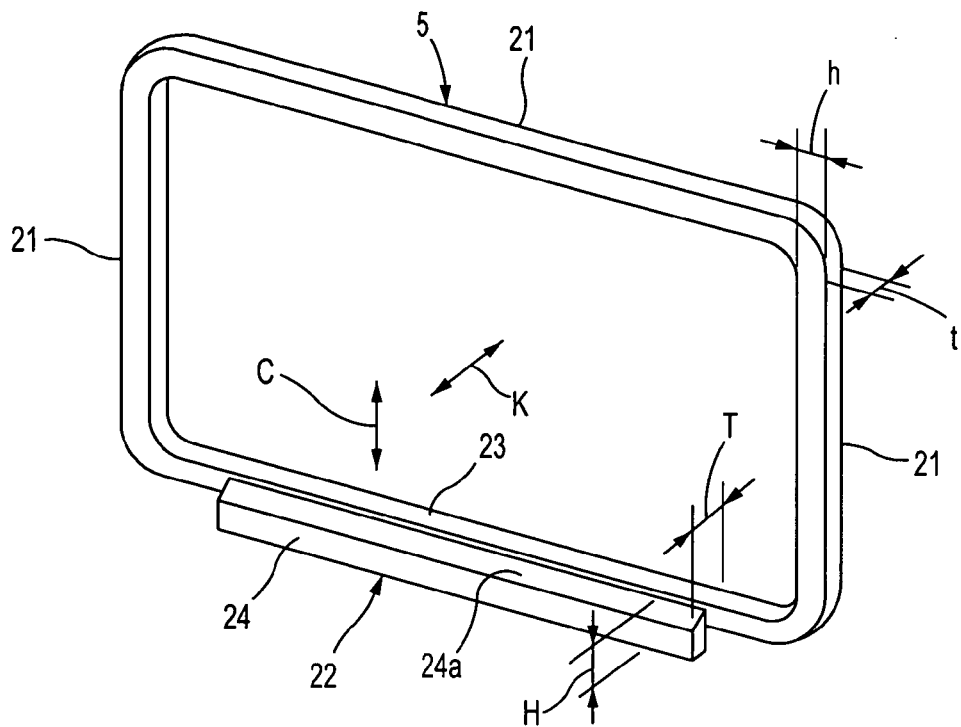
FIG. 8 is a perspective view of the seal member of the waterproof box shown in FIG. 7.
Figure 9:
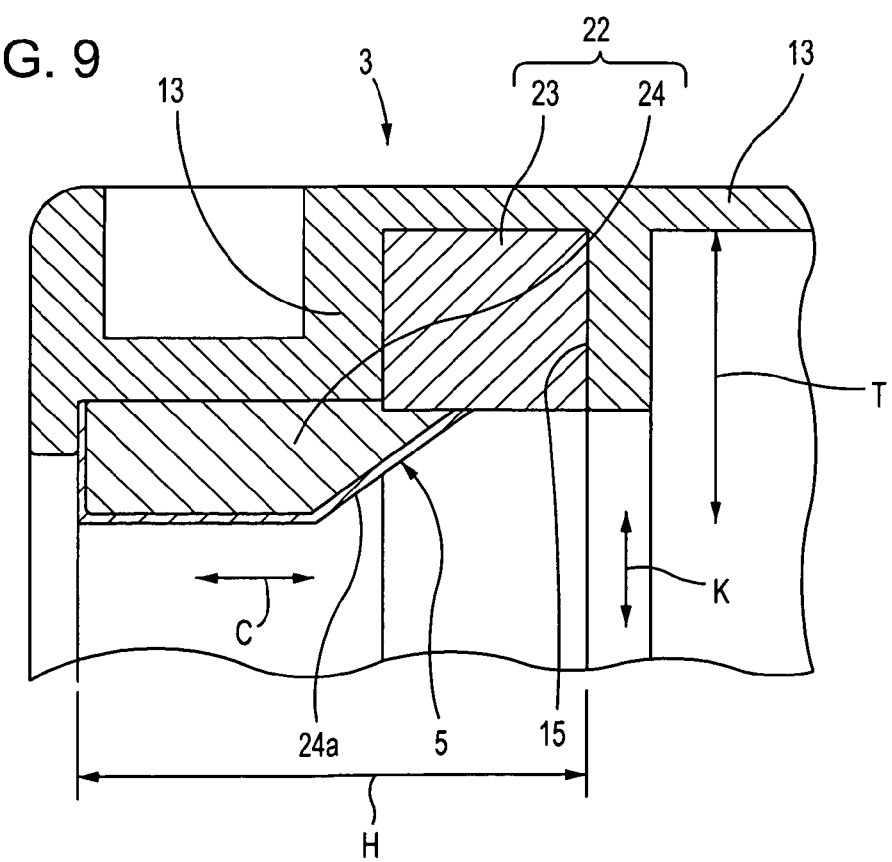
FIG. 9 is a cross-sectional view taken along the line IX-IX shown in FIG. 7.
Figure 10:
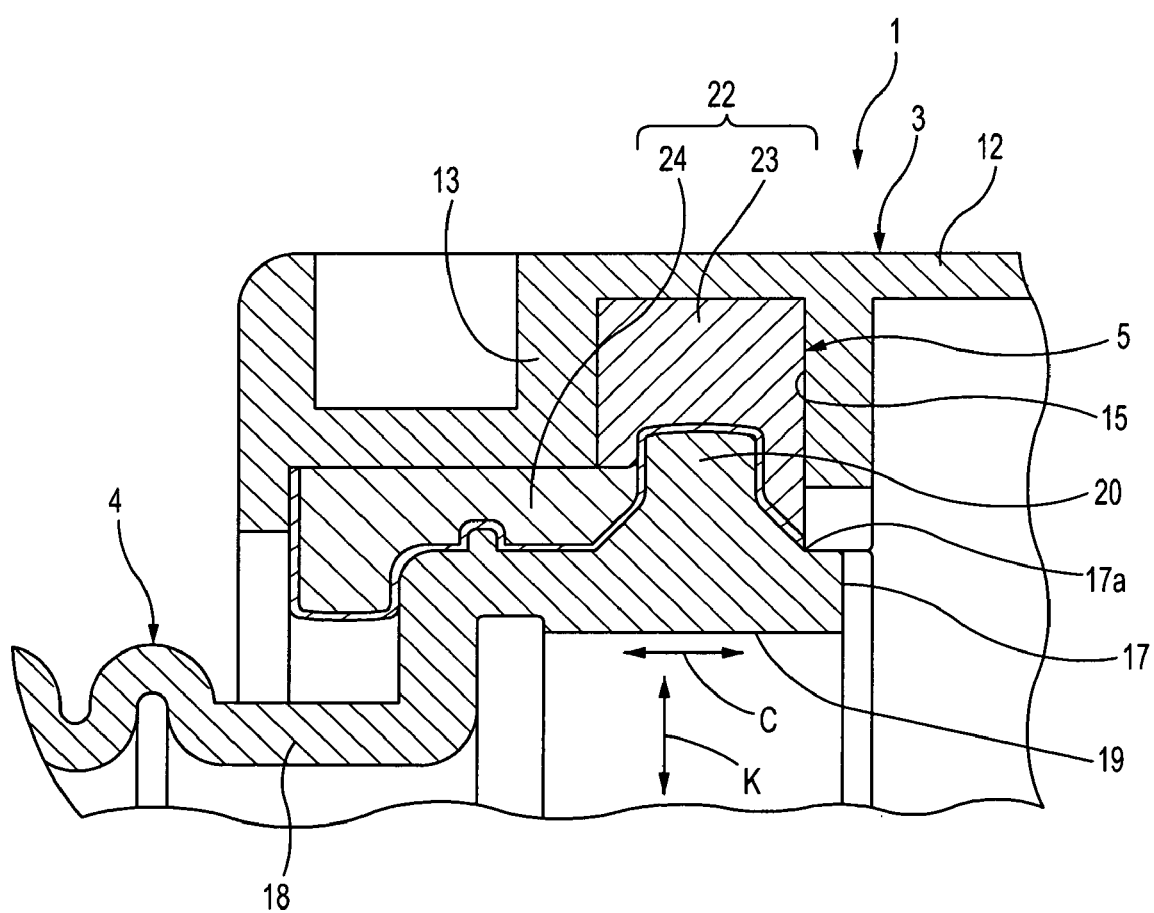
FIG. 10 is a cross-sectional view of a particular area of the waterproof box shown in FIG. 7.

In this embodiment, the contact portion 22 includes the main body 23 and the projecting body 24 as shown in FIGS. 7-9. In this embodiment, the main body 23 is formed in thickness and width equal to the other portion. The width H of the projecting body 24 is formed wider than that of the main body 23 and the projecting body 24 is piled on the main body 23 near the edge 7a of the cutout side-wall 7. The projecting body 24 is attached on the main body 23 so as to project from an outer edge of the main body 23 toward an outside of the seal member 5.

Thereby, the projecting body 24 projects from the main body 23 toward the cutout side-wall 7 of the box main body 2 and also toward the outside of the box main body 2 and the lid 3 along a perpendicular direction C perpendicular to the piling direction K (shown in FIGS. 7-9). In other words, the projecting body 24 in this embodiment corresponds both to a first projecting body and a second projecting body.

The projecting body 24 has a contact surface 24a as shown in FIGS. 7-9. The contact surface 24a is formed at an inner edge of the projecting body 24 near the cutout side-wall 7 in the full length of the projecting body 24. The contact surface 24a is slant both to the piling direction K and the perpendicular direction C perpendicular to the piling direction K with a constant slant angle in the full length thereof. The contact surface 24a is slant along the perpendicular direction C to become gradually closer to the edge 7a of the cutout side-wall 7 of the box main body 2 in accordance with position approaching the outside of the box main body 2 and the lid 3.

The contact surface 24a is arranged along the piling direction K at a position corresponding to an outer edge of the lip 20 of the grommet 4. Thereby, the contact surface 24a abuts both on the edge 7a of the cutout side-wall 7 and the lip 20 of the grommet 4 when the box main body 2 and the lid 3 are attached to each other. In this embodiment, the projecting body 24 is formed with the softer material than the main body 23.

According to the waterproof box 1 in this embodiment, by mounting the grommet 4 on the box main body 2 after passing the electric wires of the wiring harness through the grommet 4, the connector of the wiring harness is received in the box main body 2. After attaching the seal member 5 to the lid 3 by inserting the pillars 21 and the main body 23 into the seal member receiving groove 15, attaching the lid 3 on the box main body 2, the waterproof box 1 as structured above is assembled. Thereby, the seal member 5 pushed by the lip 10 arranged on the edge 7a of the side-wall 7 and the lip 20 of the grommet 4 is elastically deformed. Especially, the projecting body 24 abuts on the lip 20 of the edge 7a of the side-wall 7 and an area toward outside of the lip 20 widely over the box main body 2. The seal member 5 waterproofs between the lid 3 and the box main body 2, so that it is prevented that liquid like water penetrates into the box main body 2.

According to this embodiment, the contact surface 24a slanting both to the piling direction K of the box main body 2 and the lid 3 piling and the perpendicular direction C perpendicular to the piling direction K is provided in the full length of the contact portion 22 of the seal member 5. Thereby, a contact area of the contact portion 22, and the edge 7a of the cutout side-wall 7 and the grommet 4 becomes larger than that of the other portion of the seal member 5. Therefore, the seal member 5 fills the gap between the box main body 2 and the grommet 4 near the opening 9, so that it can be prevented that liquid like water penetrates through the gap.

Since the contact surface 24a provided in the full length of the contact portion 22 of the seal member 5 is slant to become gradually closer to the edge 7a of the cutout side-wall 7 in accordance with position approaching the outside, a contact point of the contact portion 22 and the edge 7a of the cutout side-wall 7 is positioned gradually upward in accordance with the contact point approaching an inside of the box main body 2. Thereby, it is difficult that liquid like water penetrates through the gap between the seal member 5 and the edge 7a of the cutout side-wall 7 into the box main body 2.

Since the contact portion 22 includes the main body 23, the first projecting body projecting from the main body 23 toward the cutout side-wall, and the second projecting body from the first projecting body toward the outside, so that the second projecting body is arranged mostly at an outside of the box main body from the side-walls. Thereby, it is more difficult that liquid like water penetrates through the gap between the seal member 5 and the edge 7a of the cutout side-wall 7 into the box main body 2.

According to the present invention, the main body 23 and the projecting body 24 of the contact portion 22 can be formed integrally, that is can be formed as a part of the seal member 5. Also, the main body 23 and the projecting body 24 of the contact portion 22 can be formed with the same material. According to the present invention, the contact surface 24a can be slant oppositely against the second embodiment. The second projecting body 24 can project from the main body 23 oppositely against the second embodiment.

According to the above embodiments, the waterproof box 1 receives the connector. According to the present invention, the waterproof box 1 can receive an electric connecting box, such as a relay box and a fuse box, and the other various electronic apparatuses such as ECU (electronic control unit).

According to the present invention, not only the grommet 4 but also various covers can be used as the cover member.

According to the present invention, the seal member 5 can be mounted on the box main body 2. In other words, the seal member 5 can be mounted on one of the box main body 2 and the lid 3.

While, in the embodiment, the present invention is described, it is not limited thereto. Various change and modifications can be made with the scope of the present invention.

What is claimed is:

1. A waterproof box comprising:
    a box main body having an opening formed by a plurality of side-walls surrounding the opening, wherein at least one cutout side-wall from among the plurality of side-walls is provided with a cutout formed by cutting said at least one cutout side-wall to be apart from an edge thereof close to the opening;
    a lid mounted on the box main body so as to cover the opening by being mounted on the box main body;
    a rubber seal member formed into a ring shape, and attached on one of the box main body and the lid so as to be deformed elastically for waterproofing between the box main body and the lid by abutting on edges of side-walls; and
    a cover member mounted on the box main body so as to cover the cutout by being mounted on the box main body, wherein a width of a contact portion of the rubber seal member, which abuts on the edge of the cutout side-wall provided with the cutout, is wider than that of a remaining portion of the rubber seal member other than the contact portion, and wherein the contact portion of the rubber seal member comprises a contact surface, which is slanted both in a vertical mounting direction of mounting the lid upon the box main body and in a perpendicular direction perpendicular to the vertical mounting direction so as to abut both on the edge of the cutout side-wall and the cover member, formed in a full length of said contact portion.

2. The waterproof box according to claim 1, wherein the contact portion of the rubber seal member comprises:
    a seal main body having a thickness and a width which is the same as a thickness and a width of the remaining portion;
    a first projecting body projecting from the main body toward the cutout side-wall; and
    a second projecting body projecting along the perpendicular direction from the first projecting body toward an outside of one of the box main body and the lid.

3. The waterproof box according to claim 2, wherein the contact surface is slant along the perpendicular direction to become closer to the edge of the cutout side-wall in accordance with a position approaching an outside of one of the box main body and the lid.

4. The waterproof box according to claim 3, wherein the contact portion of the rubber seal member comprises:
    a seal main body having a thickness and a width which is the same as a thickness and a width of the remaining portion;
    a first projecting body projecting from the main body toward the cutout side-wall; and
    a second projecting body projecting along the perpendicular direction from the first projecting body toward an outside of one of the box main body and the lid.

* * * * *